United States Patent
Yamamoto et al.

(10) Patent No.: US 7,500,206 B2
(45) Date of Patent: Mar. 3, 2009

(54) DELAY TIME VERIFYING METHOD WITH LESS PROCESSING LOAD

(75) Inventors: Hiroshi Yamamoto, Kanagawa (JP); Yoshiki Kashiwagi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 739 days.

(21) Appl. No.: 11/059,311

(22) Filed: Feb. 17, 2005

(65) Prior Publication Data

US 2005/0190702 A1     Sep. 1, 2005

(30) Foreign Application Priority Data

Feb. 26, 2004   (JP)   ............................ 2004-052048

(51) Int. Cl.
*G06F 17/50*   (2006.01)
(52) U.S. Cl. .................................... 716/4; 716/1; 716/6
(58) Field of Classification Search ................. 716/1, 716/4, 6
See application file for complete search history.

(56) References Cited

U.S. PATENT DOCUMENTS 5,852,445 A * 12/1998 Yoshikawa et al. .......... 345/440

FOREIGN PATENT DOCUMENTS

JP            10-116300          5/1998

OTHER PUBLICATIONS

J.M. Daga et al., "Temperature Effect on Delay for Low Voltage Applications," Design, Automation and Test in Europe, 1998, Proceedings.

* cited by examiner

*Primary Examiner*—Thuan Do
(74) *Attorney, Agent, or Firm*—Foley & Lardner LLP

(57) ABSTRACT

In a method of verifying a delay time of a target circuit section, a first determination of a shortest of short delay times of each of components of the target circuit section in two or more temperature conditions is carried out. A second determination of a longest one of long delay times of each of the components of the target circuit section in two or more temperature conditions is carried out. Then, a first summation of the shortest delay times of the components is calculated and a second summation of the longest delay times of the components is calculated. Then, whether each of the first and second summations satisfy a predetermined timing constraint is verified.

7 Claims, 6 Drawing Sheets

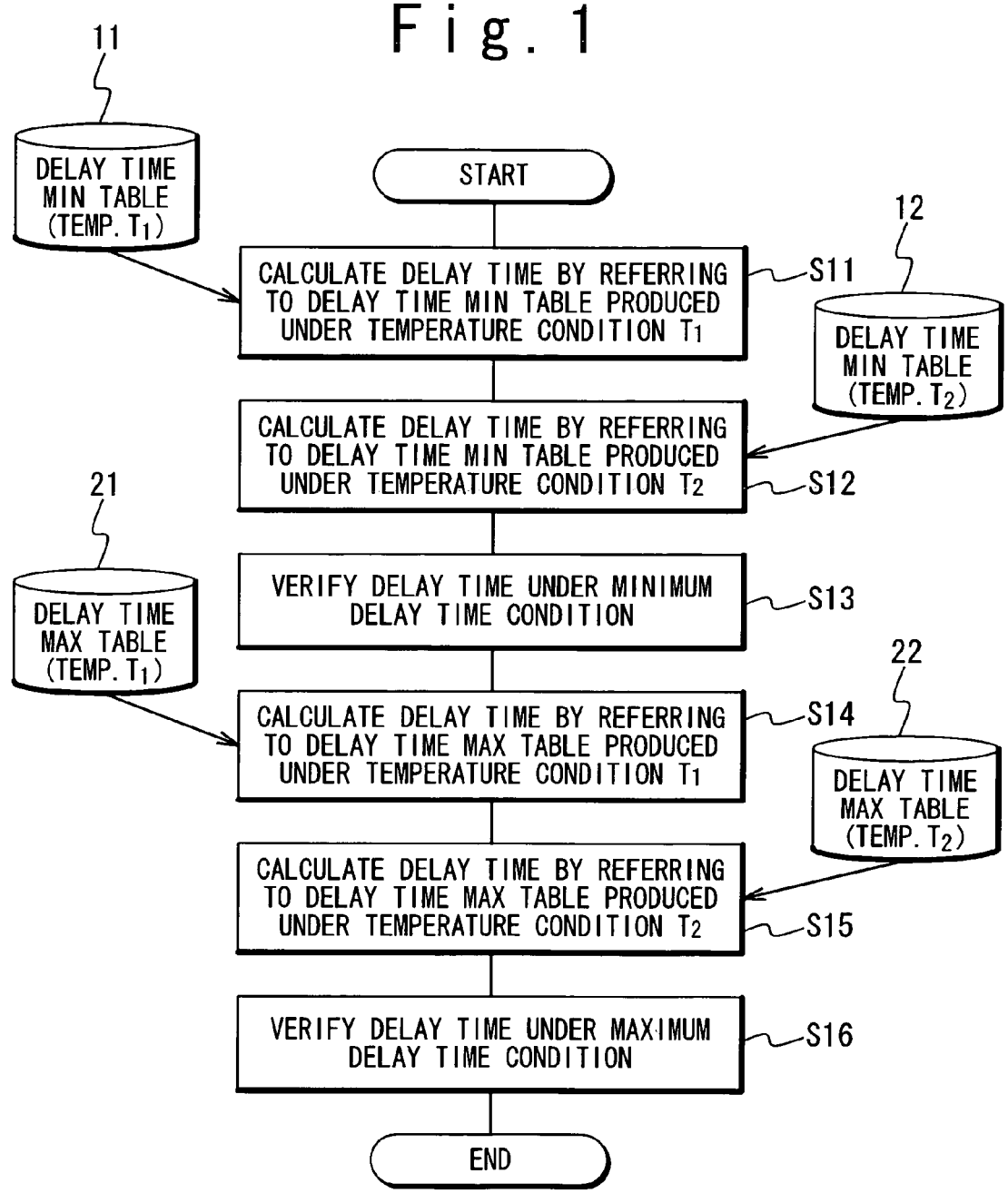

DELAY TIME VERIFYING METHOD WITH LESS PROCESSING LOAD

BACKGROUND OF THE INVENTION

1. Field of the Invention

The present invention relates to a delay time verifying system and a delay time verifying method, for verifying a delay time of a delay time verification section.

2. Description of the Related Art

In the design of a semiconductor device, timing verification (delay time verification) is carried out to verify whether a designed circuit is operable at designed timings. Such timing verification is carried out in the following manner. Here, it is supposed that a semiconductor device to be designed contains in a circuit section shown in FIG. 6. In this case, the circuit section from the output of a flip-flop A (31) to an input of a flip-flop B (32) is verified as a delay time verification section. In the timing verification, a delay time of the delay time verification section is calculated, and then whether predetermined timing constraint is met is verified based on the calculated delay time. Specifically, whether a setup time and hold time of the flip-flop B (32) are met is verified based on the delay time. When the delay time does not meet the timing constraint, there is a fear that the circuit does not operate correctly because the operation of the flip-flop B (32) is not stabilized.

In the cell-base designing, usually, a delay time table is preserved in a delay time library for each cell to indicate a two-dimensional relation of a load capacitance of the cell and a waveform slew (input slew). Here, the input slew is provided as a time necessary for a signal voltage to rise from 0 volt to a power supply voltage VDD, or a time necessary for the signal voltage to drop from the power supply voltage VDD to 0 V. An example of the delay time table is shown in the following Table 1.

TABLE 1

|  | Trf1 | Trf2 | Trf3 | Trf4 | ... |
|---|---|---|---|---|---|
| Cload1 | Tpd11 | Tpd12 | Tpd13 | Tpd14 | ... |
| Cload2 | Tpd21 | Tpd22 | Tpd23 | Tpd24 | ... |
| Cload3 | Tpd31 | Tpd32 | Tpd33 | Tpd34 | ... |
| Cload3 | Tpd41 | Tpd42 | Tpd43 | Tpd44 | ... |
| . | . | . | . | . | . |
| . | . | . | . | . | . |
| . | . | . | . | . | . |

In the table, "$C_{load}$" represents a load capacitance, "$T_{rf}$" represents an input slew, and "$T_{pd}$" represents a delay time determined based on a combination of the load capacitance and the input slew. Specifically, the load capacitance of a cell is "$C_{load1}$", the input slew thereof is $T_{rf3}$, and the delay time table is referred to to determine the delay time of the cell to be $T_{rf13}$. When the load capacitance and input slew of a cell is not written in the table, the delay time of the cell can is calculated through interpolation.

The delay time from the flip-flop A (31) to the flip-flop B (32) is determined as a summation of delay times of logical circuits A (33) to D (36) existing in the delay time verification section. The load capacitance and input slew of a cell corresponding to each of the logical circuits A (33) to D (36) are previously estimated. The delay time of each cell is determined by referring to the delay time table for every cell stored in a delay time library (not shown) based on the estimated load capacitances and input slews. Such a conventional technique is disclosed in Japanese Laid Open Patent application (JP-A-Heisei 10-116300).

The cell is usually formed from transistors. A switching speed of each transistor is variable depending on a process condition, variations in power supply voltage, or a peripheral temperature (ambient temperature). Specifically, the switching speed of the transistor is faster when the process condition is good, the power supply voltage is higher, or the ambient temperature is lower. The delay time of the cell varies as the result of the variation in the switching speed of the transistor. Therefore, the delay time of the delay time verification section satisfies a predetermined timing constraint under a certain condition, but does not satisfy the timing constraint under another condition. In order to guarantee a correct operation of the semiconductor device to be designed within an operation guarantee range, it should be verified that the delay time verification section satisfies the predetermined timing constraints in the overall range of the variations even when the delay times of the respective cells are varied.

In the conventional technique, it is obvious that the switching speed is faster when the temperature is lower, and is slower when the temperature is higher. For this reason, whether the delay time satisfies the predetermined timing constraint is verified when the delay time of the delay time verification section is shortest. At this time, the delay time is calculated by using a delay time table (delay time MIN table) which is produced under the condition that the process conditions are good, the power supply voltage is maximum within the operation guarantee voltage range, and the ambient temperature is minimum within the operation guarantee temperature range. On the other hand, whether the delay time satisfies the predetermined timing constraint is verified when the delay time of the delay time verification section is longest. The delay time is calculated by using a delay time table (delay time MAX table) which is produced under the conditions that the process conditions are bad, the power supply voltage is minimum within the operation guarantee voltage range, and the ambient temperature is maximum within the operation guarantee temperature range.

FIG. 7 is a diagram showing a time change of an output voltage of a transistor in transition from LOW to HIGH at a high temperature and a low temperature. Generally, in the transistor, the number of carriers at the low temperature is less than the number of carriers at the high temperature. Accordingly, the threshold voltage of the transistor at the low temperature is higher than the threshold voltage thereof at the high temperature. FIG. 7 shows the time necessary for the transistor to reach an ON state when a signal for turning on a transistor is supplied at a same timing in the high temperature and the low temperature. As shown in FIG. 7, the output voltage in the high temperature is higher than that in the low temperature in an initial stage of switching.

On the other hand, the carrier mobility in the low temperature is larger than in the high temperature. Accordingly, an ON current in the low temperature is higher than that in high temperature. A rising speed of the output voltage (voltage variation amount/time) is proportional to the ON current. Accordingly, the rising speed of the output voltage is higher in the low temperature than in the high temperature after the transistor has become the ON state. For this reason, generally, as shown in FIG. 7, the output voltage in the low temperature exceeds the output voltage in the high temperature at a certain time point, and rises earlier to the power supply voltage than in the high temperature. In the above, a case has been described that the output of the transistor changes from LOW to HIGH. A case is similar that the transistor changes from HIGH to LOW.

As described above, generally, while the output voltage of the cell (circuit) begins to change earlier in the high temperature, the output voltage in the low temperature shortly exceeds the output voltage in the high temperature. For this reason, it could be considered that the effect of the phenomenon that the output voltage in the high temperature changes earlier at the initial stage of switching is insignificant if the power supply voltage is sufficiently high compared with the threshold voltage. However, in recent nanometer-generation transistors, the power supply voltage is lower compared with that of a conventional generation transistor, and the difference between the threshold voltage and the power supply voltage is small. Whether the switching of a cell is completed is generally determined based on whether the output voltage of the cell has passed a predetermined voltage, e.g., a half (½) value of the power supply voltage. Therefore, when the difference between the threshold voltage and the power supply voltage is small, there is a possibility that it is determined in the high temperature that the circuit has switched at the initial stage of switching. That is, the switching speed is increased as the temperature is increased, so that inverse phenomenon is caused in temperature characteristic of the switching speed. This is disclosed in "Temperature Effect on Delay for Low Voltage Applications (CMOS jCs)" by Daga, J. M; Ottaviano, E; and Auvergne, D, (Design, Automation and Test in Europe, 1998, Proceedings, 1998).

The inverse phenomenon in the temperature characteristics is dependant upon parameters such as load capacitance, input slew, and circuit configuration, but is not always caused in transistors of a specific generation. Therefore, a case would occur that the inverse phenomenon in the temperature characteristics is caused in one of the cells in a delay time verification section, but is not caused in another cell. When the delay time verification section contains a cell that the inverse phenomenon is caused in the temperature characteristic, a delay time exists which is shorter than the delay time determined by referring to the delay time MIN table produced under the condition at the lowest temperature in the operation guarantee range. Also, a delay time exists which is longer than the delay time determined by referring to the delay time MAX table produced under the condition at the highest temperature in the operation guarantee range. Consequently, in the conventional timing verification method, whether the delay time satisfies the predetermined timing constraint cannot be determined over the entire operation guarantee range.

SUMMARY OF THE INVENTION

In an aspect of the present invention, a method of verifying a delay time of a target circuit section is achieved by carrying a first determination of a shortest of short delay times of each of components of the target circuit section in two or more temperature conditions; by carrying out a second determination of a longest one of long delay times of each of the components of the target circuit section in two or more temperature conditions; by calculating a first summation of the shortest delay times of the components; by calculating a second summation of the longest delay times of the components; and by verifying whether each of the first and second summations satisfy a predetermined timing constraint.

Here, the carrying out a first determination may be achieved by referring to a first delay time table to determine the short delay time of each of the components of the target circuit section at a first temperature, the first delay time table indicating the short delay time to a combination of a load capacitor of the component and an input slew thereof at the first temperature; and by referring to a second delay time table to determine the short delay time of each of the components of the target circuit section at a second temperature which is higher than the first temperature, the second delay time table indicating the short delay time to a combination of a load capacitor of the component and an input slew thereof at the second temperature. Also, the carrying out a second determination may be achieved by referring to a third delay time table to determine the long delay time of each of the components of the target circuit section at the first temperature, the third delay time table indicating the long delay time to a combination of a load capacitor of the component and an input slew thereof at the first temperature; and by referring to a fourth delay time table to determine the long delay time of each of the components of the target circuit section at the second temperature which is higher than the first temperature, the fourth delay time table indicating the long delay time to a combination of a load capacitor of the component and an input slew thereof at the second temperature.

Instead, the carrying out a first determination may be achieved by referring to a fifth delay time table to determine the short delay time of each of the components of the target circuit section, the fifth delay time table indicating a shorter one of the short delay times at first and second temperatures to a combination of a load capacitor of the component and an input slew thereof. Also, the carrying out a second determination may be achieved by referring to a sixth delay time table to determine the long delay time of each of the components of the target circuit section, the sixth delay time table indicating a longer one of the long delay times at the first and second temperatures to a combination of a load capacitor of the component and an input slew thereof.

In another aspect of the present invention, a method of verifying a delay time of a target circuit section including components is achieved by modifying said target circuit section such that inversion phenomenon in temperature characteristic of each of said components is not caused in a use temperature range; by carrying out a first determination of short delay times of the components; by carrying out a second determination of long delay times of the components; by calculating a first summation of the short delay times of the components; by calculating a second summation of the long delay times of the components; and by verifying whether each of the first and second summations satisfy a predetermined timing constraint. In this case, the modifying may be achieved by changing a load capacitor connected to at least one of the components. Instead, the modifying may be achieved by replacing at least one of the components by another component having a different temperature characteristic than at least one component.

Another aspect of the present invention relates to a computer executable software product for carrying out a method of verifying a delay time of a target circuit section. The method may be achieved by carrying out a first determination of short delay times of components of the target circuit section; by carrying out a second determination of long delay times of components of the target circuit section; by calculating a first summation of the short delay times of the components; by calculating a second summation of the long delay times of the components; and by verifying whether the first and second summations satisfy a predetermined timing constraint.

In another aspect of the present invention, a delay time verifying system of a delay time of a target circuit section includes first to fourth delay time tables, and a processing section. The first delay time table indicates a short delay time to a combination of a load capacitor of each of components of the target circuit section and an input slew thereof at a first temperature, and the second delay time table indicates a short delay time to a combination of a load capacitor of the component and an input slew thereof at a second temperature which is higher than the first temperature. The third delay time table indicates a long delay time to a combination of a load capacitor of the component and an input slew thereof at a first temperature, and the fourth delay time table indicating a long delay time to a combination of a load capacitor of the component and an input slew thereof at a second temperature. The processing section refers to the first delay time table to determine the short delay time of each of the components at the first temperature, refers to the second delay time table to determine the short delay time of each of the components at the second temperature, refers to the third delay time table to determine the long delay time of each of the components at the first temperature, refers to the fourth delay time table to determine the long delay time of each of the components at the second temperature, calculates first summations of the short delay times of the components to the first and second temperatures, calculates second summations of the long delay times of the components to the first and second temperatures, and verifies whether each of the first and second summations satisfies a predetermined timing constraint.

In another aspect of the present invention, a delay time verifying system of a delay time of a target circuit section includes fifth and sixth delay time tables and the processing section. The sixth delay time table indicates a shorter one of short delay times at first and second temperatures to a combination of a load capacitor of each of components of the target circuit section and an input slew thereof, and the sixth delay time table indicating a longer one of the long delay times at the first and second temperatures to a combination of a load capacitor of the component and an input slew thereof. The processing section refers to the fifth delay time table to determine the short delay time of each of the components at the first temperature, refers to the sixth delay time table to determine the long delay time of each of the components at the first temperature, calculates a first summation of the short delay times of the components to the first and second temperatures, calculates a second summation of the long delay times of the components to the first and second temperatures, and verifies whether each of the first and second summations satisfies a predetermined timing constraint.

In another aspect of the present invention, a delay time verifying system of a delay time of a target circuit section includes seventh and eighth delay time tables and the processing section. The seventh delay time table indicating a short delay time at a first temperature to a combination of a load capacitor of each of components of the target circuit section and an input slew thereof, and the eighth delay time table indicating a long delay time at a second temperature to a combination of a load capacitor of the component and an input slew thereof. The processing section changes the target circuit section such that inversion phenomenon in temperature characteristic of each of the components is not caused, refers to the seventh delay time table to determine the short delay time of each of the components at the first temperature, refers to the eighth delay time table to determine the long delay time of each of the components at the first temperature, calculates a first summation of the short delay times of the components to the first and second temperatures, calculates a second summation of the long delay times of the components to the first and second temperatures, and verifies whether each of the first and second summations satisfies a predetermined timing constraint.

In another aspect of the present invention, a method of verifying a delay time of a target circuit section, is achieved by carrying out a first determination of delay times of components of the target circuit section at a first temperature; by carrying out a second determination of delay times of components of the target circuit section at a second temperature; by calculating first summations of the delay times of the components at the first temperature; by calculating a second summation of the long delay times of the components at the second temperature; and by verifying whether each of the first and second summations satisfy a predetermined timing constraint.

BRIEF DESCRIPTION OF THE DRAWINGS

FIG. 1 is a flow chart showing a procedure of a delay time verifying method according to a first embodiment of the present invention;

DESCRIPTION OF THE PREFERRED EMBODIMENTS

Hereinafter, a delay time verifying system of the present invention will be described in detail with reference to the attached drawings. A delay time verifying method is carried out by using the delay time verifying system as a computer system operating based on a software program. The delay time verifying system includes a processing section. In the present invention, it is verified whether the delay time in an optional section of a semiconductor device as a delay time verification section, for example, a section from the output of a flip-flop A 31 to the input of a flip-flop B 32 shown in FIG. 6, satisfies preset timing constraint. In this case, it is assumed that a delay time of each of cells monotonously increases or decreases as the temperature rises.

First Embodiment

FIG. 1 is a flow chart showing a procedure of a delay time verifying method in a semiconductor integrated circuit according to the first embodiment of the invention. In FIG. 1, the following steps S11 to S16 are executed by the processing section. A delay time library (not shown) contains two tables, namely, first and second delay time MIN tables 11 and 12 for the verification of a case where the delay time of each cell is shortest. The tables 11 and 12 are configured similarly to the conventional delay time table shown in Table 1. The first delay time MIN table 11 is produced under conditions that process conditions are good, a power supply voltage is maximum within an operation guarantee voltage range, and an ambient temperature is the lowest temperature T1 within the operation guarantee temperature range, similarly to the conventional delay time MIN table. The second delay time MIN table 12 is produced under conditions that the process conditions are good, the power supply voltage is maximum within the operation guarantee voltage range, and the ambient temperature is the highest temperature T2 within the operation guarantee temperature range.

In addition, the delay time library contains two tables, namely, first and second delay time MAX tables 21 and 22 for the verification of a case where the delay time of the each cell is the longest. The tables 21 and 22 are configured similarly to the conventional delay time table shown in Table 1. The first delay time MAX table 21 is produced under conditions that the process conditions are bad, the power supply voltage is minimum within the operation guarantee voltage range, and the ambient temperature is set to the lowest temperature T1 within the operation guarantee temperature range. The second delay time MAX table 22 is produced under conditions that the process conditions are bad, the power supply voltage is minimum within the operation guarantee voltage range, and the ambient temperature is the highest temperature T2 within the operation guarantee temperature range, similarly to the conventional delay time MAX table.

Figure 6:
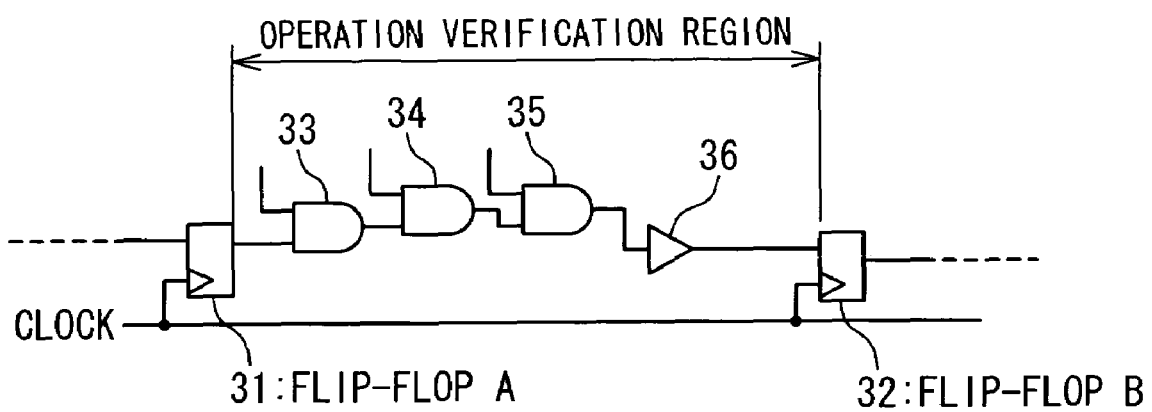
FIG. 6 is a block diagram showing a practical example of a delay time verification section.
Figure 7:
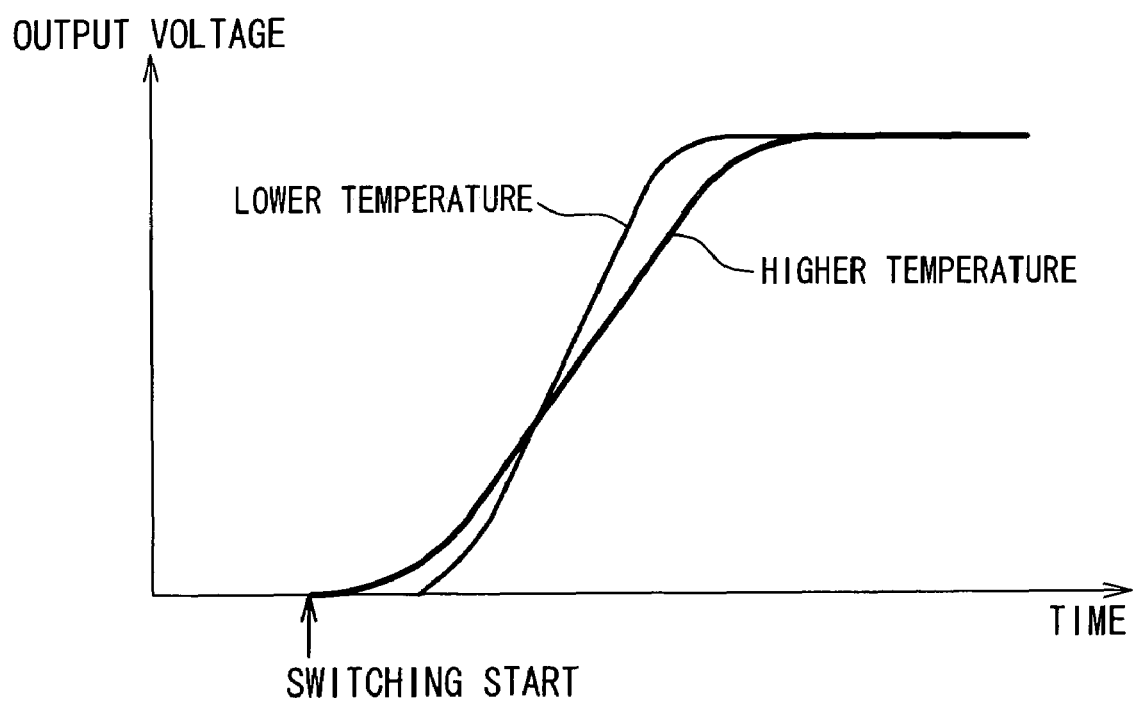
FIG. 7 is a graph showing a time change of an output voltage when a transistor is switched from LOW to HIGH.

A load capacitance and input slew of each cell within the delay time verification section are previously estimated. First, delay times of the respective cells within the delay time verification section, i.e., corresponding to logical circuits A 33 to D 36 in the example shown in FIG. 6, are determined from the first delay time MIN table 11 based on the load capacitances and input slews of the each cell. Then, a summation of the delay times of the respective cells in the delay time verification section at the temperature T1 is calculated as a total delay time (step S11). Subsequently, delay times of the respective cells in the delay time verification section are determined from the second delay time MIN table 12 based on the load capacitance and input slew of the each cell. Then, a summation of the delay times of the respective cells in the delay time verification section at the temperature T2 is calculated as a total delay time (step S12).

It is verified whether a shorter one of the total delay time at the temperature calculated at the step S11, and the total delay time at the temperature T2 calculated at the step S12 satisfies the timing constraint preset for the delay time verification section (step S13). Thus, whether the semiconductor device can properly operate is verified when the delay time of the delay time verification section of semiconductor device becomes shortest in the preset operation guarantee range of the operation guarantee voltage range and the operation guarantee temperature range.

The similar processing is carried out a case where the delay time becomes longest. Specifically, delay times of respective cells in the delay time verification section are determined from the first delay time MAX table 21 based on the load capacitance and input slew of each cell. Then, a summation of the delay times of the respective cells in the delay time verification section at the temperature T1 is calculated as a total delay time (step S14). Subsequently, delay times of the respective cells in the delay time verification section are determined from the second delay time MAX table 22 based on the load capacitance and input slew of each cell. Then, a summation of the delay times of the respective cells in the delay time verification section at the temperature T2 is calculated as a total delay time (step S15). Then, it is verified whether longer one of the total delay time at the temperature T1 calculated at step S14, and the total delay time at the temperature T2 calculated at step S15 satisfies the timing constraint preset for the delay time verification section (step S16).

In this way, according to the present embodiment, the delay time of the delay time verification section when the delay time is shortest is calculated by using the first delay time MIN table 11 produced for the lowest temperature T1 in the operation guarantee temperature range, and the second delay time MIN table 12 produced for the highest temperature T2 in the operation guarantee temperature range. Consequently, the shortest delay time of the delay time verification section can be correctly calculated even when the delay time verification section contains a cell having a positive temperature coefficient, i.e., an increasing delay time as the temperature rises, and a cell having a negative temperature coefficient, i.e., a decreasing delay time as the temperature rises.

Also, according to the present embodiment, the delay time of the delay time verification section when the delay time is longest is calculated by using the first delay time MAX table 21 produced for the lowest temperature T1 in the operation guarantee temperature range, and the second delay time MAX table 22 produced for the highest temperature T2 in the operation guarantee temperature range. Consequently, the longest delay time of the delay time verification section can be correctly calculated even when the delay time verification section contains a cell having a positive temperature coefficient, and a cell having a negative temperature coefficient. Therefore, in the present embodiment, it is verified whether the shortest delay time and the longest delay time of the delay time verification section satisfy the timing constraint, and thereby, the semiconductor device can be guaranteed to correctly operate within the operation guarantee range.

It is supposed that a large number of cells which have very long delay times along with the temperature rise and a large number of cells which have very short delay times along with the temperature rise are present at random in a delay time verification section. In such a case, there could be a case that the delay time of a delay time verification section is neither shortest nor longest at the lowest temperature or highest temperature within the operation guarantee range. For solving this problem, it is desirable that in addition to the verifications carried out at the temperatures T1 and T2, a verification is carried out at the temperature T3 by determining the delay time of the delay time verification section by using a delay time MIN table and delay time MAX table produced for an optional temperature T3 (T1<T2<T3) within the operation guarantee range.

Second Embodiment

A second embodiment of the present invention will be described herebelow.

Figure 2A:
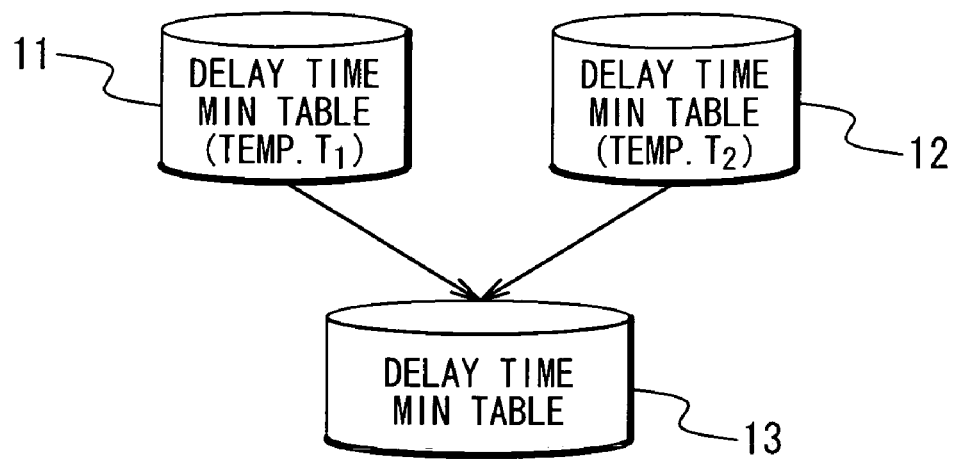
FIGS. 2A and 2B are diagrams showing production of delay time tables used when the delay time of each cell is verified in the delay time verifying method according to the second embodiment of the present invention.
Figure 2B:
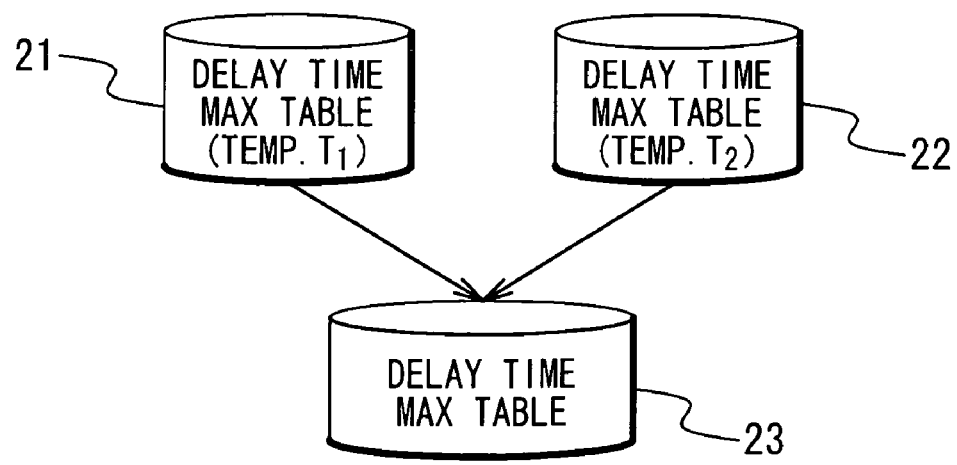

FIGS. 2A and 2B are diagrams showing production of delay time tables used when the delay time of each cell is verified in the delay time verifying method according to the second embodiment of the present invention. In the second embodiment, the delay time verification is carried out by using a delay time MIN table 13 into which the delay time MIN tables 11 and 12 are merged and a delay time MAX table 23 into which the delay time MAX tables 21 and 22 are merged. The delay time verification method is executed by the processing section by using the tables shown in FIGS. 2A and 2B.

The delay time MIN table 13 is produced by comparing a delay time stored in the first delay time MIN table 11 and a delay time stored in the second delay time MIN table 12, and shorter one of the two delay times is stored into the delay time MIN table 13. Specifically, for the load capacitance and the input slew for each cell, the delay time retrieved from the first delay time MIN table 11 and the delay time retrieved from the second delay time MIN table 12 are compared with each other to select shorter one of the delay times, and the selected delay time is stored into the delay time MIN table 13. Similarly, the delay time MAX table 23 is produced by comparing a delay time stored in the first delay time MAX table 21 and a delay time stored in the second delay time MAX table 22 to select longer one of the two delay times, and by storing the selected delay time into the delay time MIN table 13.

For the verification of the delay time of the delay time verification section under the condition of the shortest delay time, the delay times of respective cells are determined from the delay time MIN table 13 and the load capacitances and input slews of the respective cells, and the determined delay times are summated. Then, whether the summation of the delay times satisfies the timing constraint preset for the delay time verification section is verified. Similarly, for the verification of the delay time of the delay time verification section under the condition of the longest delay time, the delay times of respective cells are determined from the delay time MAX table 23 and the load capacitances and input slews of the respective cells, the determined delay times are summated, and the whether the summation of the delay times satisfies the timing constraint preset for the delay time verification section.

According to the present embodiment, the delay time MIN table 13 and delay time MAX table 23 are used to calculate the delay time under the condition that the delay time is shortest and the delay time under the condition that the delay time is longest, and the delay time verification is carried out based on the calculated delay times. In this case, in each of the delay time MIN table 13 and delay time MAX table 23, delay times at the temperature T1 and the delay times at the temperature T2 are merged. Therefore, while the delay time verification section is verified under a severe condition that would not occur in practical, two types of delay times under the shortest delay time condition and the longest delay time condition are calculated only once, respectively. That is, in the second embodiment, the time required for the verification can be reduced, compared with the first embodiment in which two types of delay times under the shortest delay time condition and the longest delay time condition are calculated twice, respectively.

Third Embodiment

The delay time verifying method according to the third embodiment of the present invention will now be described herebelow.

Figure 3:
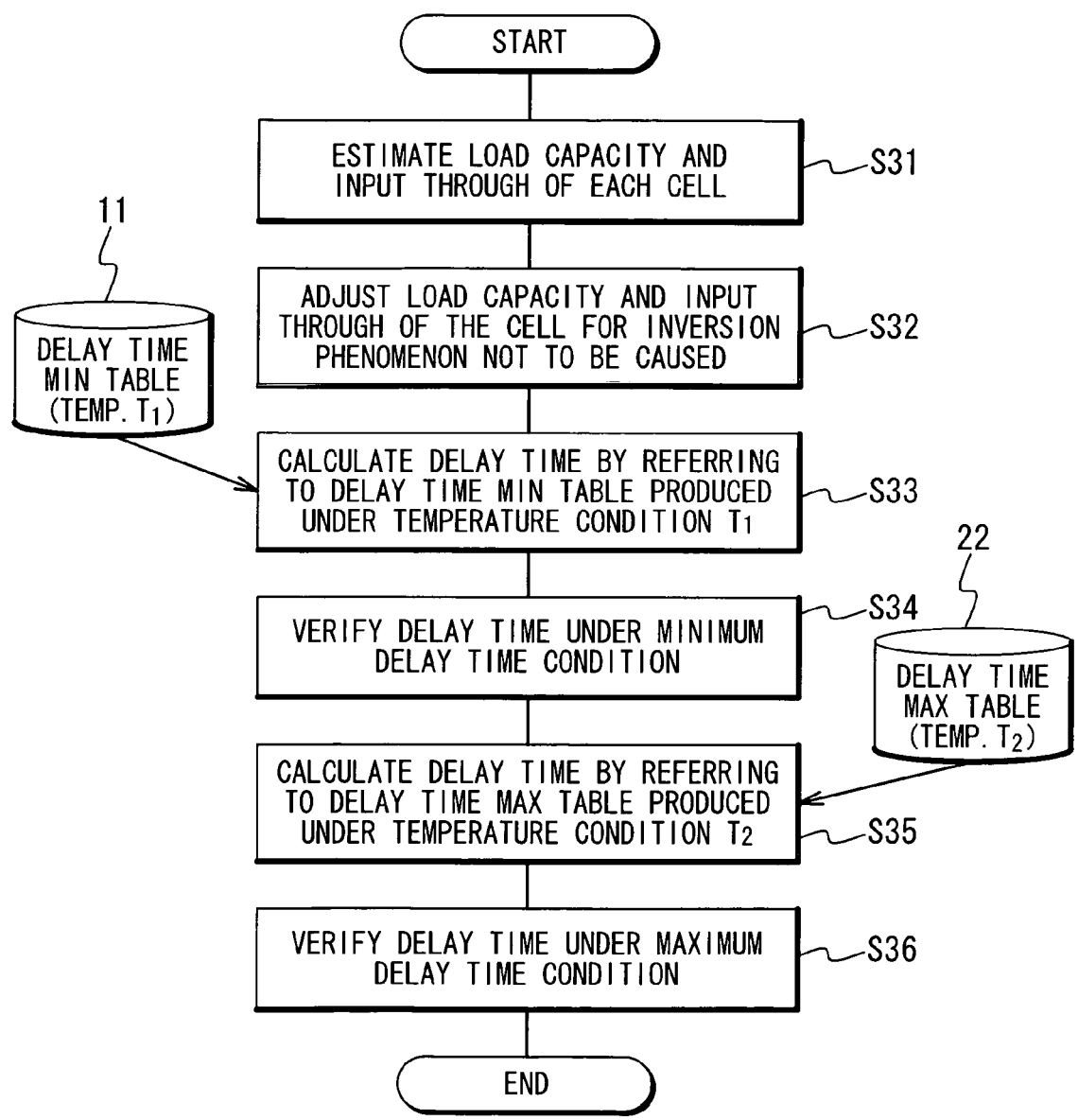
FIG. 3 is a flow chart showing a procedure of the delay time verifying method according to a third embodiment of the present invention.

FIG. 3 is a flow chart showing a procedure of the delay time verifying method according to the third embodiment of the present invention. In FIG. 3, the following steps S31 to S36 are executed by the processing section. Whether the inverse phenomenon in the temperature characteristics of each cell occurs depends on conditions such as the type of the cell, the load capacitance, and the input slew. In the third embodiment, cells to be used, load capacitances, input slews, and the like are restricted. The respective cells in the delay time verification section are used under conditions under which the inverse phenomenon does not occur in the temperature characteristics, for calculation of the delay times.

Figure 4:
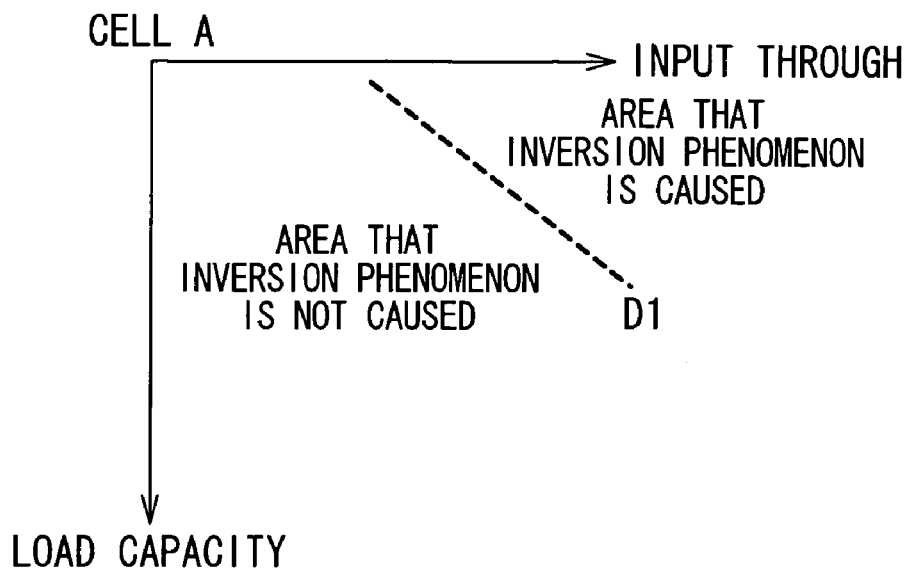
FIG. 4 is a diagram showing a region where an inverse phenomenon is caused in temperature characteristic of a cell and a region where the inverse phenomenon is not caused.

FIG. 4 is a diagram showing a region where the inverse phenomenon is caused in the temperature characteristic of a cell A and a region where the inverse phenomenon is not caused. Generally speaking, the inverse phenomenon in the temperature characteristic is caused in a range where the load capacitance of the cell A is low and the input slew thereof is large. The region where the inverse phenomenon is caused in the temperature characteristics and the region where the inverse phenomenon is not caused in the temperature characteristic are determined by comparing combinations of the delay time and the input slew in the delay time table for the temperature T1 and the delay time table for the temperature T2. In FIG. 4, the region above a boundary line D1 indicates the region where the inverse phenomenon is caused in the temperature characteristics. Also, the region below the boundary line D1 indicates the region where the inverse phenomenon is not caused in the temperature characteristics. The region where the inverse phenomenon is caused in the temperature characteristics and the region where the inverse phenomenon is not caused in the temperature characteristics are previously determined before the delay time verification.

In the delay time verification, a load capacitance and an input slew for each of the cells in the delay time verification section is first estimated (step S31). Subsequently, whether the respective cell is used in a state that the inverse phenomenon is caused in the temperature characteristic is determined based on the load capacitance and the input slew of the respective cells. As a result of the determination, when it is determined that a cell is used in the state that the inverse phenomenon is caused in the temperature characteristic, the cell being used is changed to change an output load capacitance or to change the input slew. Thus, adjustment is carried out in such a manner that the cell is used in a region where the inverse phenomenon is not caused in the temperature characteristic (step S32).

In the step S32, for example, in case of the cell A having the characteristic shown in FIG. 4, whether a combination of the load capacitance and the input slew estimated at step S31 belongs to the region where the inverse phenomenon is caused in the temperature characteristic is determined. As a result of the determination, when it is determined that the combination of the load capacitance and the input slew belongs to the region where the inverse phenomenon is caused in the temperature characteristic, an adjustment cell is inserted to a front or rear stage of the cell A, to change the load capacitance and the input slew so that the combination of the changed load capacitance and input slew belongs to the region where the inverse phenomenon is not caused in the temperature characteristics. Alternatively, the cell A is replaced with a new cell that has the same function as the cell A but has a circuit configuration different from that of the cell A. Thus, in the new cell, the inverse phenomenon is not caused in the temperature characteristic in the combination of the load capacitance and input slew estimated at the step S31. In this way, the adjustment is carried out such that the cell itself being used is replaced with the new cell.

Figure 5:
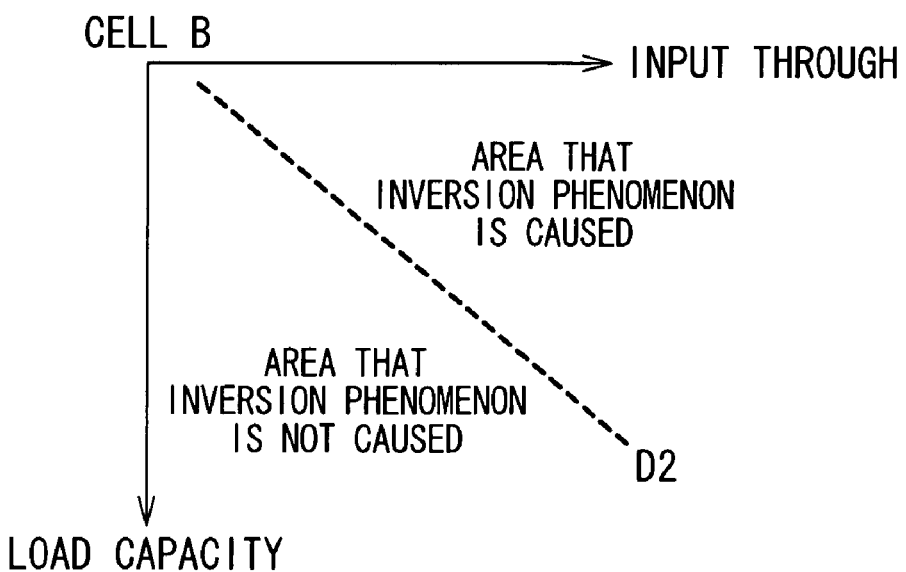
FIG. 5 is a diagram showing a region where the inverse phenomenon is caused in temperature characteristic of a cell and a region where the inverse phenomenon is not caused.

FIG. 5 is a diagram showing a region where the inverse phenomenon is caused in the temperature characteristic of a cell B and the region where the inverse phenomenon is not caused. The region where the inverse phenomenon is caused in the temperature characteristic of the cell A (FIG. 4) and the region where the inverse phenomenon is caused in the temperature characteristic of the cell B (FIG. 5) are compared with each other. At this time, the cell B has a wider region where the inverse phenomenon is caused in the temperature characteristic, that is, the cell B can be said to be more likely to cause the inverse phenomenon in the temperature characteristic. When the cell B is more likely to cause the inverse phenomenon in the temperature characteristic, the cell B is preferably prohibited to use for the semiconductor device since an adjustment range for the combination of the load capacitance and the input slew at the step S32 is too narrow. For example, criteria are preferably established so that the cell B itself is separated as being unusable and is not mounted in a semiconductor device. For example, when discriminators D1 and D2 shown in FIGS. 4 and 5 are close to y=x where x is the input slew of a cell and y is the load capacitance thereof, the cell is determined to be easy to cause the inverse phenomenon in the temperature characteristic. Also, in the graph of FIG. 5, when a ratio of an area of the region where the inverse phenomenon is caused in the temperature characteristic and an area of the region where the inverse phenomenon is not caused in the temperature characteristic is close to "1" or greater or equal to "1," the cell is determined to easy to cause the inverse phenomenon.

After the cell in the delay time verification section is adjusted at the step S32 so as to be used under the condition that the inverse phenomenon is not caused in the temperature characteristic, the delay time MIN table 11 produced under the condition for the temperature T1 is referred to to calculate a delay time of the delay time verification section (step S33). Subsequently, whether the delay time of the delay time verification section satisfies the predetermined timing constraint is verified when the delay time is shortest (step S34). Also, the delay time MAX table 22 produced under the condition for the temperature T2 is referred to to calculate a delay time of the delay time verification section (step S35). Subsequent, whether the delay time of the delay time verification section satisfies the predetermined timing constraint is determined when the delay time is longest (step S36).

As described above, according to the third embodiment, the cells in the delay time verification section are adjusted not to cause the inverse phenomenon in the temperature characteristics. Therefore, the delay time of the delay time verification section is shortest at the lowest temperature T1 within the operation guarantee temperature range and is longest at the highest temperature T2 within the operation guarantee temperature range. Thus, by using the method similar to the conventional method, the delay time is calculated based on the delay time MIN table 11 produced under the condition of the temperature T1, and the shortest delay time of the delay time verification section can be calculated. Also, the delay time can be calculated by using the delay time MAX table 22 produced under the condition of the temperature T2, and the longest delay time can be calculated. Further, according to the third embodiment, the two types of delay times under the shortest delay time condition and the longest delay time condition can be calculated once, respectively. Accordingly, the time required for the verification can be reduced, compared to the first embodiment, in which the calculation of the delay time twice for each of two types of delay times.

It should be noted that according to the first embodiment, the timing verification is carried out by using a shorter one or a longer one of the delay time of the delay time verification section at the temperature T1 and the delay time of the delay time verification section at the temperature T2. However, instead, the delay time at the temperature T1 and the delay time at the time T2 are compared with each other for each of the cells in the delay time verification section to determine the shorter or longer delay time, and the total delay time of the delay time verification section may be determined based on a summation of the determined delay times. In this case, the verification similar to the verification in the second embodiment can be carried out.

In the above, the present invention has been described based on the embodiments. However, the delay time verifying method of the present invention is not limited only to the embodiments. Modifications of the delay time verifying method described in the above embodiments are included in the scope of the present invention.

The delay time verifying method of the present invention uses the delay time table produced under a plurality of temperature conditions to calculate the delay times of the verification target section when the delay time becomes shortest or when the delay time becomes longest. Consequently, even when the inverse phenomenon in the temperature characteristic is caused, the delay time verifying method can verify whether the delay time of the verification target section satisfies the preset timing constraint.

What is claimed is:

1. A method of verifying a delay time of a target circuit section including components, comprising:
    carrying out a first determination of a shortest one of short delay times of each of said components in two or more temperature conditions;
    carrying out a second determination of a longest one of long delay times of each of said components in two or more temperature conditions;
    calculating a first summation of said shortest delay times of said components;
    calculating a second summation of said longest delay times of said components; and
    verifying whether each of said first and second summations satisfy a predetermined timing constraint.

2. The method according to claim 1, wherein said carrying out a first determination comprises:
    referring to a first delay time table to determine said short delay time of each of said components of said target circuit section at a first temperature, said first delay time table indicating said short delay time to a combination of a load capacitor of said component and an input slew thereof at said first temperature; and
    referring to a second delay time table to determine said short delay time of each of said components of said target circuit section at a second temperature which is higher than said first temperature, said second delay time table indicating said short delay time to a combination of a load capacitor of said component and an input slew thereof at said second temperature.

3. The method according to claim 2, wherein said carrying out a second determination comprises:
    referring to a third delay time table to determine said long delay time of each of said components of said target circuit section at said first temperature, said third delay time table indicating said long delay time to a combination of a load capacitor of said component and an input slew thereof at said first temperature; and
    referring to a fourth delay time table to determine said long delay time of each of said components of said target circuit section at said second temperature which is higher than said first temperature, said fourth delay time table indicating said long delay time to a combination of a load capacitor of said component and an input slew thereof at said second temperature.

4. The method according to claim 3, wherein said first temperature is a lowest temperature within an operation guarantee range, and said second temperature is a highest temperature within an operation guarantee range.

5. The method according to claim 1, wherein said carrying out a first determination comprises:
    referring to a fifth delay time table to determine said short delay time of each of said components of said target circuit section, said fifth delay time table indicating the shortest one of said short delay times at first and second temperatures to a combination of a load capacitor of said component and an input slew thereof.

6. The method according to claim 5, wherein said carrying out a second determination comprises:

referring to a sixth delay time table to determine said long delay time of each of said components of said target circuit section, said sixth delay time table indicating the longest one of said long delay times at said first and second temperatures to a combination of a load capacitor of said component and an input slew thereof.

7. The method according to claim 6, wherein said first temperature is a lowest temperature within an operation guarantee range, and said second temperature is a highest temperature within an operation guarantee range.

* * * * *

UNITED STATES PATENT AND TRADEMARK OFFICE
CERTIFICATE OF CORRECTION

| | | |
|---|---|---|
| PATENT NO. | : 7,500,206 B2 | Page 1 of 1 |
| APPLICATION NO. | : 11/059311 | |
| DATED | : March 3, 2009 | |
| INVENTOR(S) | : Yamamoto et al. | |

It is certified that error appears in the above-identified patent and that said Letters Patent is hereby corrected as shown below:

On the Title page,

[*] Notice: Subject to any disclaimer, the term of this patent is extended or adjusted under 35 USC 154(b) by 739 days Delete the phrase "by 739 days" and insert -- by 1051 days --

Signed and Sealed this

Twenty-third Day of March, 2010

David J. Kappos
*Director of the United States Patent and Trademark Office*